United States Patent
Palone

(10) Patent No.: US 9,513,543 B2
(45) Date of Patent: Dec. 6, 2016

(54) METHOD FOR FORMING A NON-DEFORMABLE PATTERNED TEMPLATE

(71) Applicant: Eastman Kodak Company, Rochester, NY (US)

(72) Inventor: Thomas W. Palone, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 474 days.

(21) Appl. No.: 14/085,042

(22) Filed: Nov. 20, 2013

(65) Prior Publication Data

US 2015/0140220 A1 May 21, 2015

(51) Int. Cl.
| | | |
|---|---|---|
| *G03F 7/00* | (2006.01) | |
| *B29C 70/70* | (2006.01) | |
| *B29C 70/68* | (2006.01) | |
| *B29C 59/00* | (2006.01) | |
| *B29C 33/38* | (2006.01) | |

(52) U.S. Cl.
CPC ......... *G03F 7/0002* (2013.01); *B29C 33/3878* (2013.01); *B29C 59/005* (2013.01); *B29C 70/688* (2013.01); *B29C 70/70* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,558,827 A * | 9/1996 | Howes | ................ | B29C 33/3878 156/63 |
| 5,669,303 A * | 9/1997 | Maracas | ................ | B05C 1/027 101/327 |
| 5,725,788 A * | 3/1998 | Maracas | ................ | B05D 1/185 216/11 |
| 5,783,264 A * | 7/1998 | Howes | ................ | B29C 33/3878 428/13 |
| 5,944,862 A * | 8/1999 | Howes | ................ | B29C 33/3878 428/13 |
| 6,916,584 B2 | 7/2005 | Sreenivasan et al. | | |
| 7,140,861 B2 | 11/2006 | Watts et al. | | |
| 7,157,036 B2 | 1/2007 | Choi et al. | | |
| 7,195,733 B2 * | 3/2007 | Rogers | ................ | B82Y 10/00 264/496 |
| 7,363,854 B2 | 4/2008 | Sewell | | |
| 7,476,523 B2 * | 1/2009 | Schueller | ................ | B05D 1/283 101/327 |
| 7,704,425 B2 | 4/2010 | Heidari et al. | | |
| 7,919,029 B2 * | 4/2011 | Gauzner | ............. | B29C 33/3878 264/1.33 |
| 7,927,976 B2 * | 4/2011 | Menard | ................ | B82Y 10/00 101/368 |
| 8,323,018 B2 * | 12/2012 | Gauzner | ............. | B29C 33/3878 425/385 |
| 8,420,124 B2 | 4/2013 | DeSimone et al. | | |
| 8,795,560 B2 * | 8/2014 | Zhu | ........................ | B82Y 10/00 264/101 |
| 9,193,198 B2 * | 11/2015 | Palone | ...................... | B41K 3/00 |
| 9,193,199 B2 * | 11/2015 | Palone | ...................... | B41K 3/00 |
| 2002/0050220 A1 * | 5/2002 | Schueller | ................ | B05D 1/283 101/486 |
| 2004/0089979 A1 * | 5/2004 | Rubin | ................... | B29C 59/002 264/293 |
| 2005/0238967 A1 * | 10/2005 | Rogers | ................... | B82Y 10/00 430/5 |
| 2008/0055581 A1 * | 3/2008 | Rogers | ................... | B82Y 10/00 355/95 |

(Continued)

OTHER PUBLICATIONS

Eric J. Wilhelm; Design of a Liquid Embossing Machine, Massachusetts Institute of Technology, Jun. 2001.

*Primary Examiner* — Benjamin Schiffman
(74) *Attorney, Agent, or Firm* — Nelson A. Blish; William R. Zimmerli

(57) ABSTRACT

A method for forming a non-deformable patterned template includes providing a stable mesh, wherein the stable mesh is resistant to deformation; providing a curable liquid polymer; placing the stable mesh in the curable liquid polymer such that the stable mesh is completely enclosed within the liquid polymer; curing the liquid polymer to form a polymer sheet with the stable mesh embedded therein; and forming a surface pattern on at least one of the faces of the polymer sheet, the surface pattern including at least two fiducial marks.

13 Claims, 10 Drawing Sheets

(56) References Cited

U.S. PATENT DOCUMENTS

| | | | |
|---|---|---|---|
| 2008/0131548 A1* | 6/2008 | Gauzner | B29C 33/3878 425/175 |
| 2008/0230773 A1* | 9/2008 | Dickey | B82Y 10/00 257/40 |
| 2010/0018420 A1* | 1/2010 | Menard | B82Y 10/00 101/333 |
| 2010/0200146 A1* | 8/2010 | Zhu | B82Y 10/00 156/62.2 |
| 2012/0058312 A1* | 3/2012 | Gauzner | B29C 33/3878 428/195.1 |
| 2015/0140156 A1* | 5/2015 | Palone | G03F 7/0002 425/385 |
| 2015/0140220 A1* | 5/2015 | Palone | G03F 7/0002 427/355 |
| 2015/0231908 A1* | 8/2015 | Palone | B41K 3/00 101/482 |
| 2015/0231909 A1* | 8/2015 | Palone | B41K 3/00 101/327 |
| 2016/0059603 A1* | 3/2016 | Palone | B41K 3/00 101/483 |

\* cited by examiner

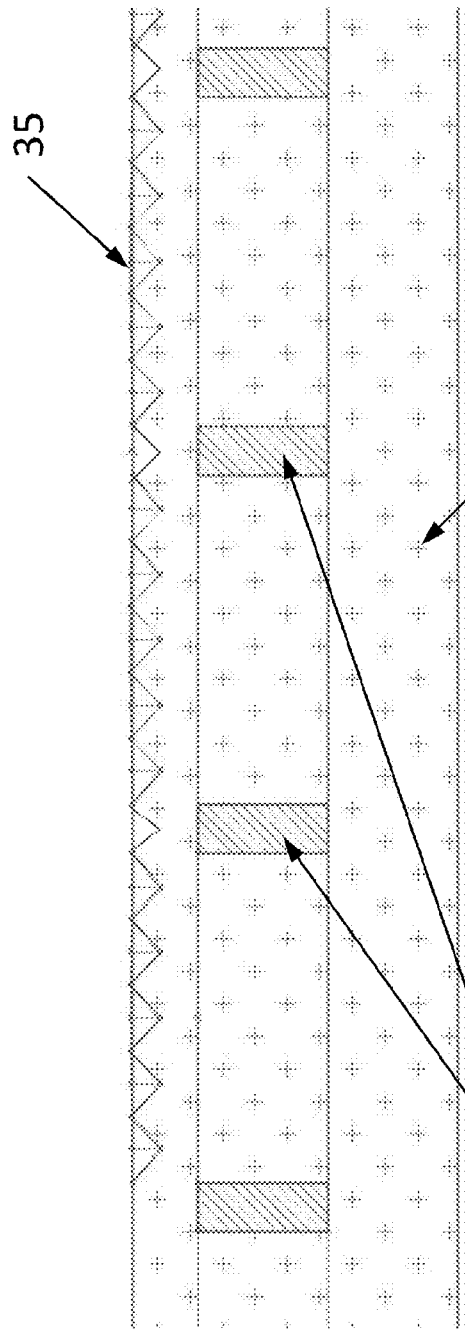
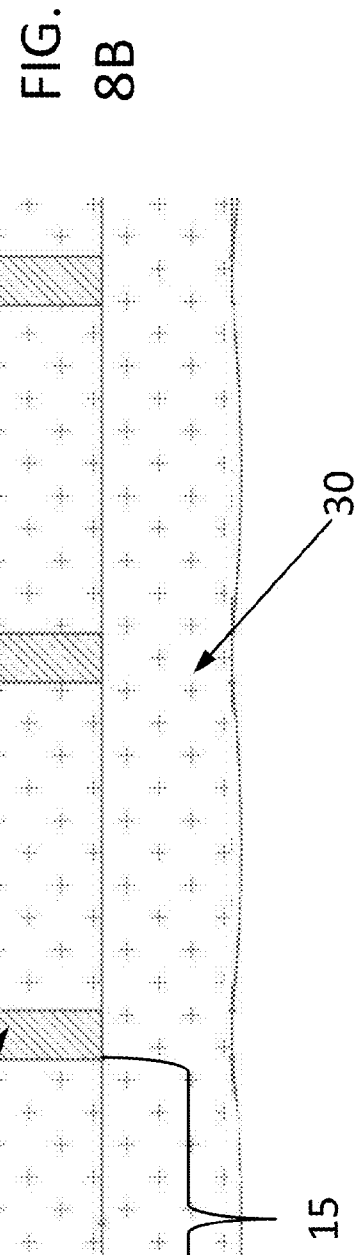
FIG. 8A
FIG. 8B

METHOD FOR FORMING A NON-DEFORMABLE PATTERNED TEMPLATE

CROSS REFERENCE TO RELATED APPLICATIONS

Reference is made to commonly-assigned copending U.S. patent application Ser. No. 14/085,006, (now U.S. Publication No. 2015/0140156) filed Nov. 20, 2013, entitled NON-DEFORMABLE PATTERNED TEMPLATE, by Palone; the disclosure of which is incorporated herein.

FIELD OF THE INVENTION

This invention relates to microfabrication of microstructures by embossing of a liquid or polymeric substrate using a patterned elastomeric stamp or mold or template. In particular, this invention relates to the production of a patterned stamp.

BACKGROUND OF THE INVENTION

Nanoimprint lithography is a method of fabricating nanometer scale patterns by mechanical deformation of imprint resist and subsequent processing. The imprint resist can be a thermally softened or photo-initiated liquid coating that is cured by heat or UV light during the imprinting. A template is brought into contact with the liquid and the liquid is cured. The cured liquid includes an imprint of any patterns formed in the template. Alignment of the template with the substrate is performed prior to curing the liquid as described in U.S. Pat. No. 6,916,584. Adhesion between the resist and the template must be controlled to allow proper release, U.S. Pat. No. 7,157,036.

A nano-pattern "parent" is produced using lithography on a silicon or glass parent. The parent pattern, sometimes called a positive image, is created using durable or environmentally stable materials, for example, a chrome positive created on glass. The pattern is then replicated on a liquid Polydimethylsiloxane (PDMS) layer, sometimes called a child layer or negative image. The PDMS is then cured. The final image is used as a template or stamp to reproduce the image on multiple products. The PDMS child pattern is then replicated onto another liquid layer, for example an epoxy-based negative photoresist (SU-8), re-creating the original positive image. Su-8 can be hardened using a combination of light and heat.

Various techniques can be used for making the pattern transfer from the parent pattern to the child template. For example U.S. Pat. No. 8,420,124 teaches a contact molding technique and U.S. Pat. No. 7,704,425 teaches an imprint method. The resulting stamp, made from an elastic polymer, is known to be compliant. The compliance can be useful for example, to bend the stamp when it is applied to a substrate for pattern transfer in order to eliminate trapped air and ensure a good contact with the photoresist surface as discussed in U.S. Pat. No. 7,363,854. U.S. Pat. No. 7,140,861 teaches attaching the elastomeric stamp to a rigid transparent substrate to allow the substrate to control the bending of the stamp into an arc. Wilhelm (Thesis, Massachusetts Institute of Technology, June 2001) teaches casting the stamp around spring steel. As a result of the stresses, however, and under repeated bends, separation of the elastomer from the substrate or steel will occur resulting in waste and short life for the template.

Despite the good properties of PDMS, there is a possibility of mechanical stress and thermal expansion causing errors in the moldable layer. As a result, U.S. Pat. No. 7,704,425 teaches performing all processing steps when using the stamp to transfer a pattern to a substrate at a constant control temperature, which is inconvenient in a manufacturing environment.

What is needed is a simple means to make a reinforced elastomeric template or stamp that is easy to mount either flat or with some curvature. It must also be resistant to mechanical stress and thermal expansion and have excellent durability. Finally, for UV curing during the pattern transfer process, the stamp must pass light even with the reinforcing substrate in place.

SUMMARY OF THE INVENTION

Briefly, according to one aspect of the present invention a non-deformable patterned template, used as a stamp in the production of stamped parts, can be produced, comprising: a stable mesh, wherein the stable mesh is resistant to deformation; a polymer sheet with the stable mesh embedded therein, wherein the polymer sheet is formed using a liquid polymer adapted to receive the stable mesh, and curing the liquid polymer after the stable mesh has been placed within the liquid polymer; and a surface pattern placed on at least one face of the polymer sheet, the surface pattern optionally including at least two fiducial marks.

Due to the stable mesh, which is resistant to deformation, the template is resistant to deformation due to changes in temperature of the template or water content of the template in response to changes in the environment. The template is also resistant to deformation due to applied tension to the template.

The template is resistant to deformation due to changes in temperature of the template in response to applied heat including radiation, convective, conductive, or resistive heating. The template is also resistant to deformation due to changes in temperature of the template in response to applied radiation, wherein the radiation includes infra-red light, visible light, electromagnetic induction, or ultra-violet light.

The stabilizing mesh that is embedded in the template is formed by producing a pattern of openings in a continuous sheet. The pattern of openings can include cross-hatch, hexagonal, diamond-shaped, circular, oval, rectangular, or polygonal. The pattern of openings in the mesh results in the mesh being sufficiently transparent to allow actinic radiation to pass through the mesh The template's stable mesh can include one or more fiducial marks that are aligned to the at least two fiducial marks of the surface pattern. The template's stable mesh defines a plurality of anchor points corresponding to the portions of the continuous sheet remaining after the openings have been formed. The anchor points of the mesh limit the deformation of the polymer sheet to regions of the template corresponding to the openings of the mesh.

In another embodiment, the pattern of openings in the stabilizing mesh is structured to cause the mesh to function as a flexure.

The invention and its objects and advantages will become more apparent in the detailed description of the preferred embodiment presented below.

BRIEF DESCRIPTION OF THE DRAWINGS

FIGS. 8A and 8B shows the stabilizing effect of the mesh on the PDMS stamp.

DETAILED DESCRIPTION OF THE INVENTION

The present invention will be directed in particular to elements forming part of, or in cooperation more directly with the apparatus in accordance with the present invention. It is to be understood that elements not specifically shown or described may take various forms well known to those skilled in the art.

A typical material used in nano-replication is Polydimethylsiloxane (PDMS) although other materials may be suitable. The PDMS is typically degassed, then poured onto a precise lithography featured master or parent. These typically include silicon or chrome on glass masters. The PDMS stamp or child now contains the negative featured pattern of the master. Numerous low-cost PDMS child stamps can be replicated from the expensive parent master.

The resulting PDMS stamp is a low durometer polymeric sheet, which may be used as a mold or embossing stamp. The featured pattern is transferred from the PDMS stamp into a material that is thermally softened or photo-initiated, or a combination of both. The PDMS material properties are typical of an elastomer. Maintaining global registration and size with these elastomeric properties is difficult to automate in a manufacturing system. Combining a stable perforated material within the PDMS stamp's thickness results in a stamp that has the desirable properties of a polymer such as flexibility and negates the undesirable properties of a polymer such as poor dimensional stability.

Figure 1:
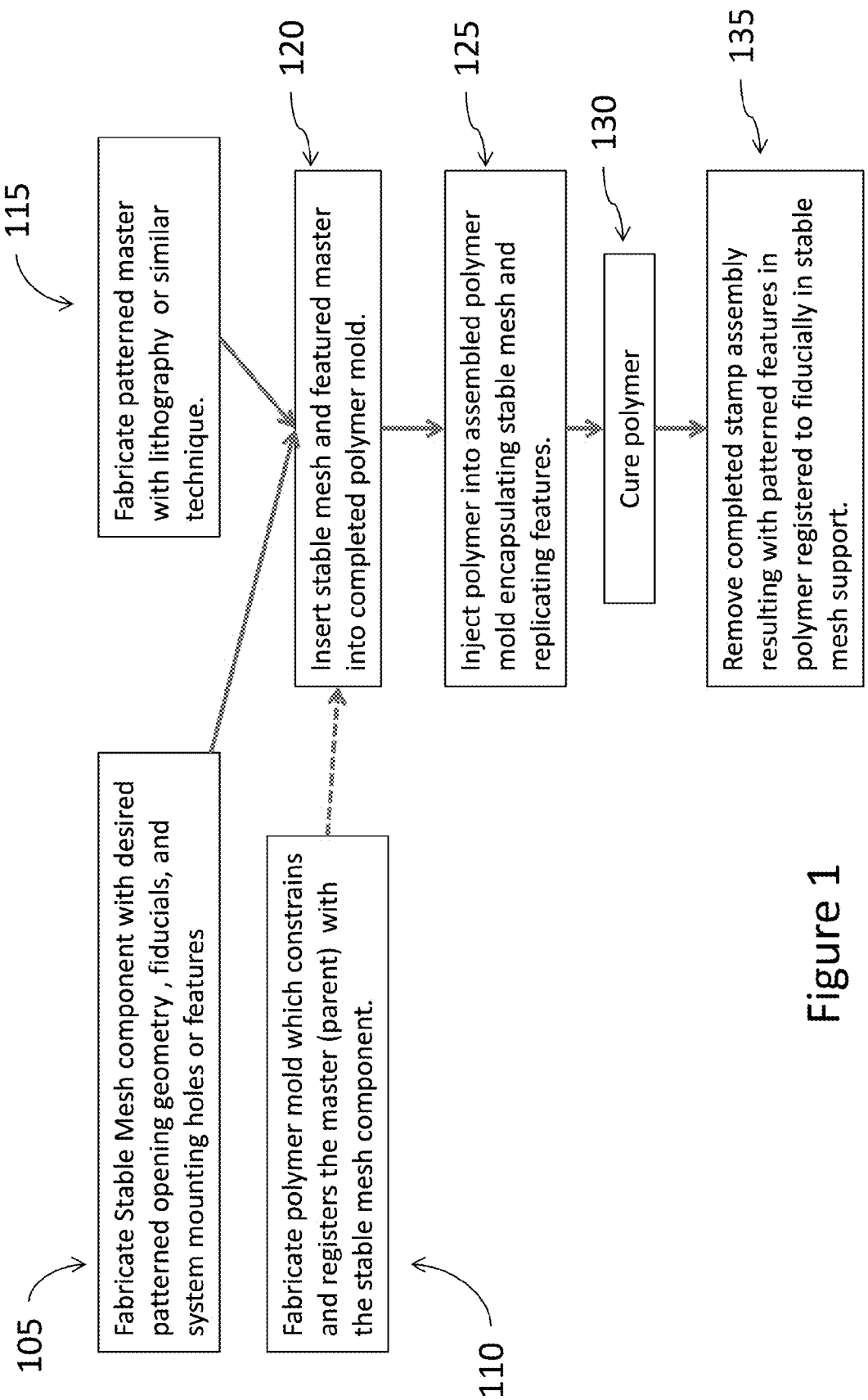
FIG. 1 shows the process for fabricating a stable mesh stamp.

Referring now to FIG. 1, a process for the manufacture of a mesh stabilized PDMS stamp is described. The process starts with fabricating a stable mesh component 105 with the desired patterned opening geometry, fiducials, and system mounting holes or features. The stable mesh component can be manufactured from most any material that exhibits superior stability compared to PDMS and similar polymers. A preferred material for the stable mesh component is invar, a nickel-iron alloy consisting of around 36% nickel and 64% iron, notable for its uniquely low coefficient of thermal expansion (CTE).

To form the mesh stabilized stamp a lithographic mold 110 is made that is adapted to constrain and register the master (parent) inverse pattern 115 with the stable mesh component. The stable mesh 105 and feature master 115 are then inserted into the polymer mold 120.

When creating the PDMS child stamp 125, the stable perforated (mesh) material is insert-molded within the PDMS thickness, at the desired distance from the feature patterned surface. The stable mesh material may contain fiducials which are precisely aligned to the lithography-featured master during the stamp casting process. The stable mesh is perforated with the desired frequency and pattern of openings which the PDMS envelops and locks the stamp to the stable mesh backbone. The stable mesh's material properties (i.e. CTE) may be tailored to the cast polymer sheet (PDMS) material properties and the manufacturing process/application.

The manufacturing process is completed by heat or photo curing the polymer 130 and removing the completed stamp assembly with the patterned features in polymer registered to fiducially in stable mesh support 135. Heating may include radiation, convective, conductive, or resistive heating.

Figure 2:
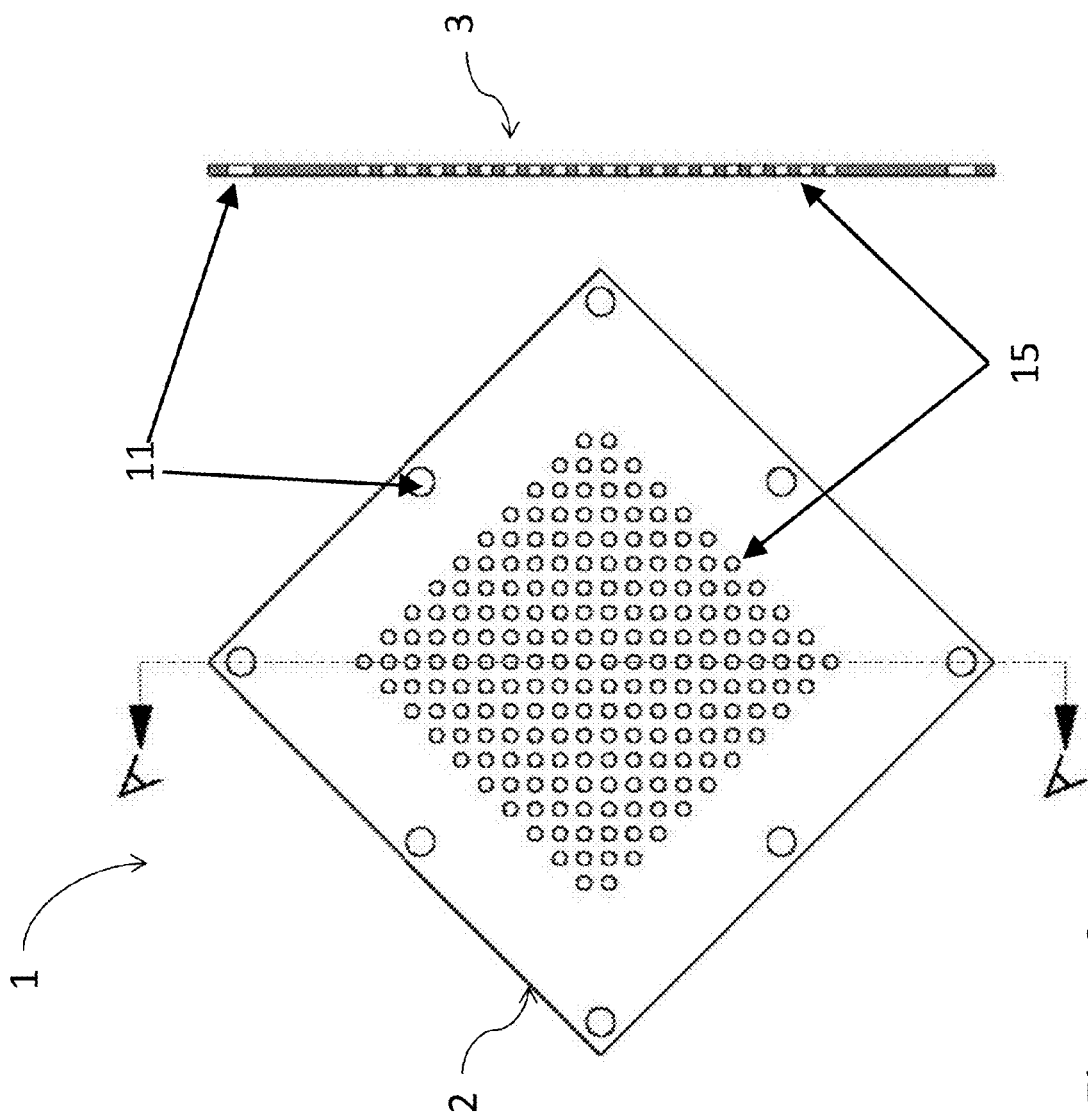
FIG. 2 shows the stable mesh in face and side view.

Referring now to FIG. 2, an example design for a stable mesh 1 in shown in face 2 and side 3 views (section A-A). The stable mesh has mounting holes 11 around the edges of the mesh face and outside of the region that the polymer stamp will be cast. In the area that the polymer stamp will be cast, the stable mesh 1 has an array of round openings 15 that serve to both stabilize the stamp and to allow light to pass through the mesh.

Figure 3:
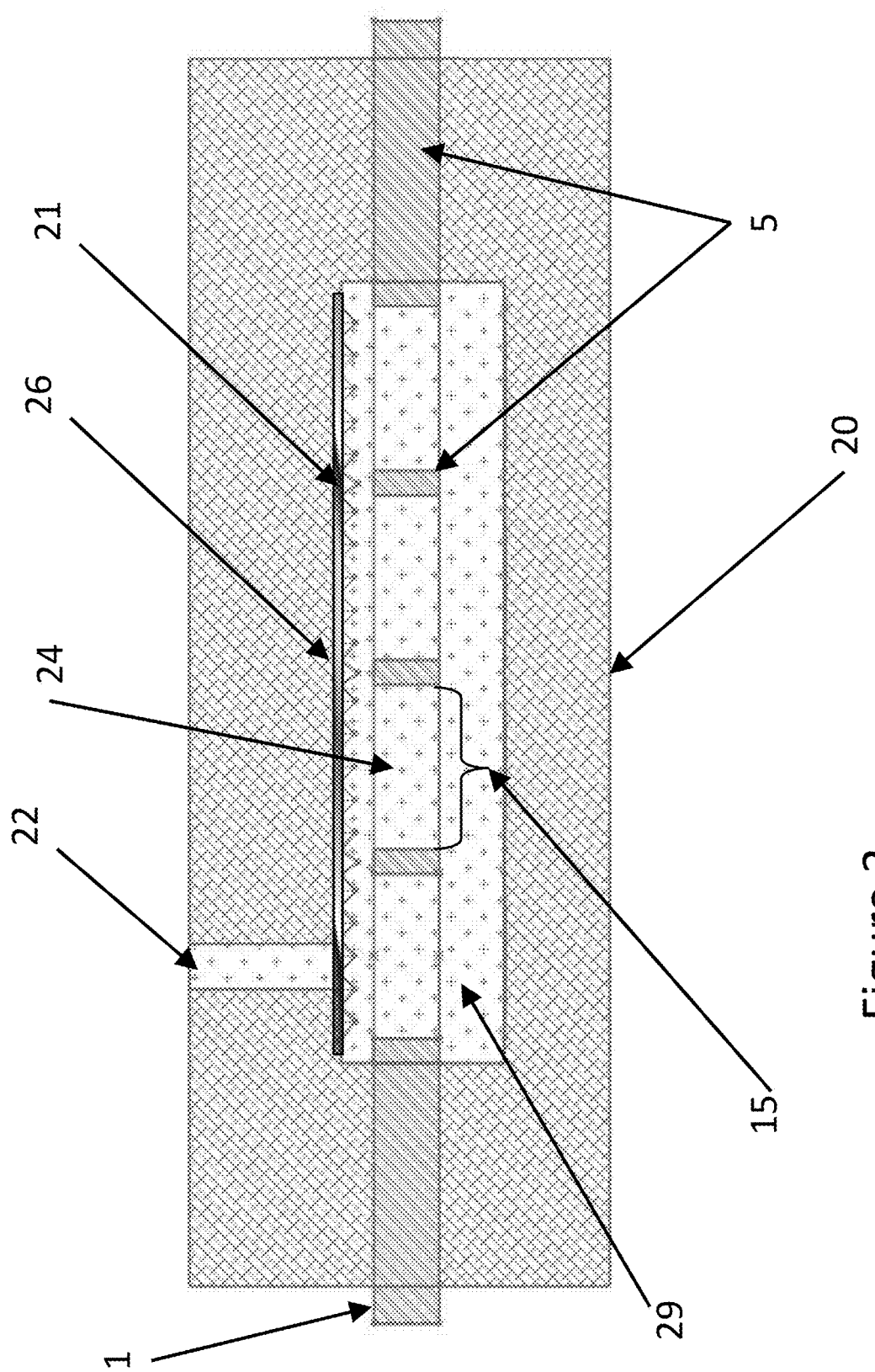
FIG. 3 shows the stable mesh in place in a mold for the casting of the PDMS stamp.

Referring now to FIG. 3, the stable mesh 1 is in place in a mold 20 for the casting of the PDMS stamp. The mold 20 features at least one fill port 22 and the cast volume 29 which will form the stamp. At least one surface 26 of the mold has the lithographically formed master pattern. The master pattern can be formed directly on the surface 26 of the mold or it can be formed outside of the mold and attached, for example adhesively, to the surface 26 of the mold. The stable mesh is located in the mold by use of the stable mesh mounting holes so that the mesh in located in register with the master pattern. In this respect, locating features such as a post or a clamping feature such as a bolt going through the mounting holes 11 on the sides of the stable mesh can be used. The cast volume 29 contains stable mesh structures 5 and stable mesh openings 15.

Figure 4:
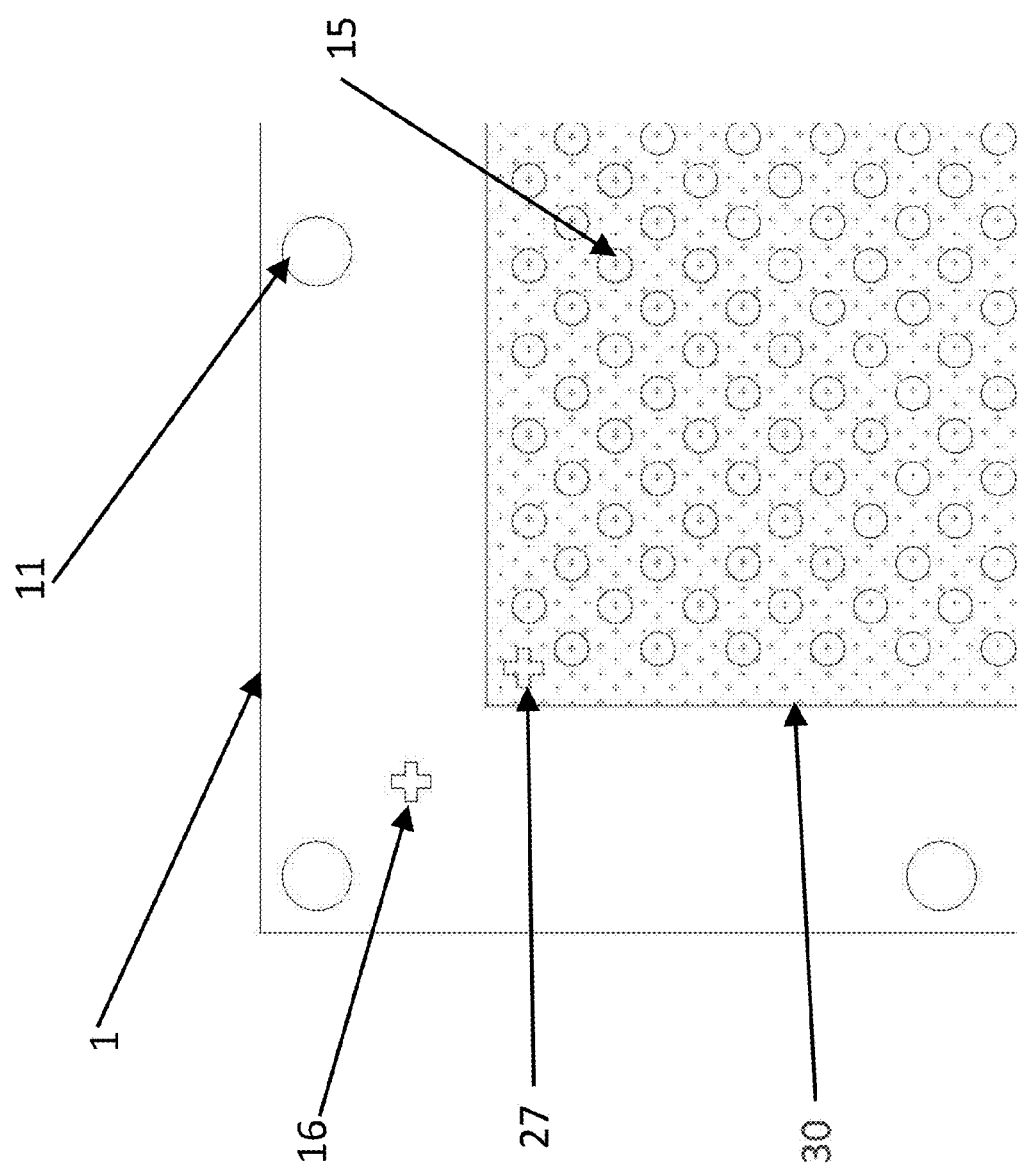
FIG. 4 shows a detail of the stable mesh.

FIG. 4 shows a detail of the stable mesh 1 illustrating the stable mesh mounting holes which are used to attach and register the stable mesh to the mold. Also shown are the stable mesh sheet fiducial 16 and the master pattern fiducial 27. The easily observed stable mesh fiducial is in a known relationship to the master parent fiducial. FIG. 4 also shown the stamp material (hatched area) and its relationship with the master parent 26 and the stable mesh openings 15.

Figure 5:
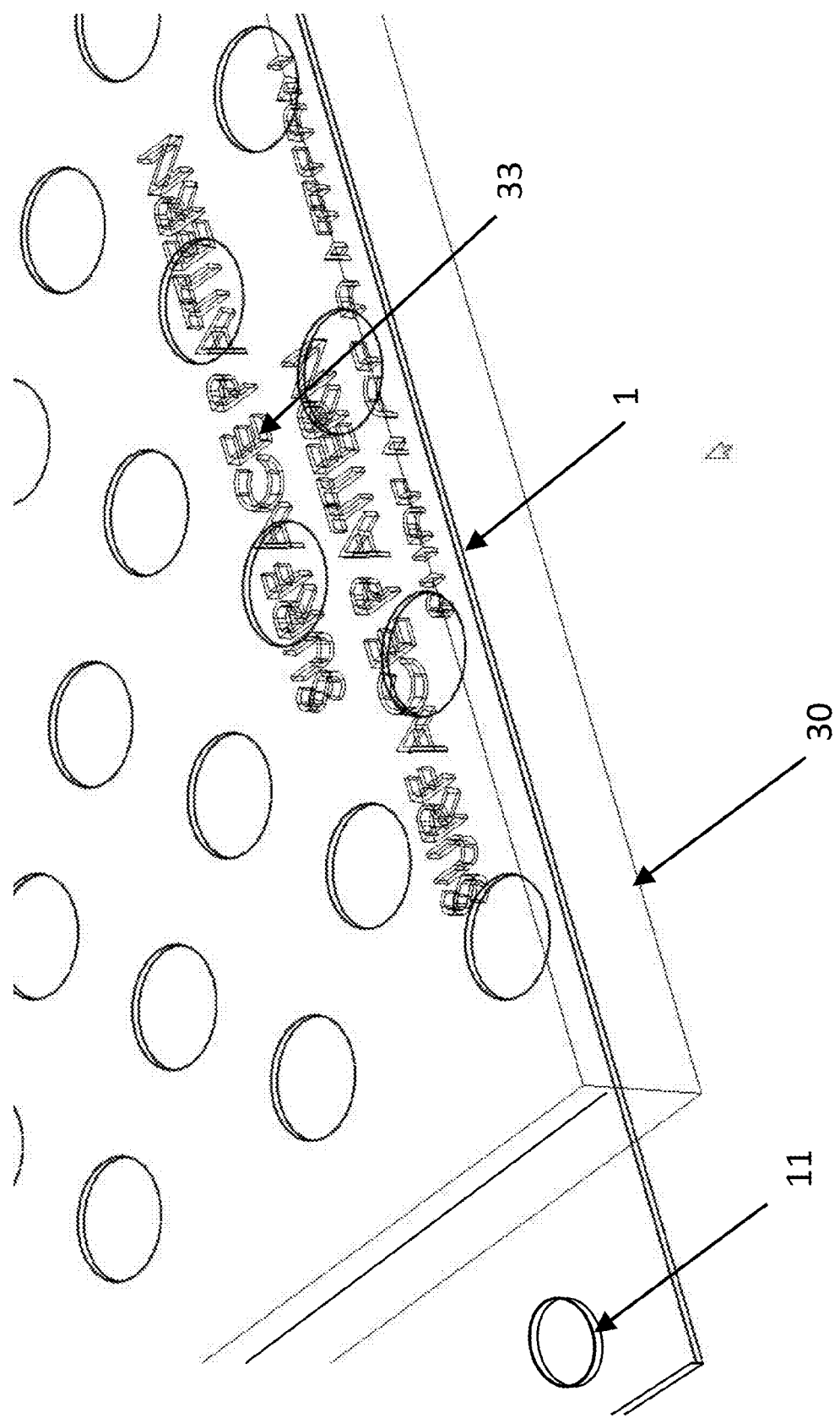
FIG. 5 shows the finished stamp with stable mesh and a surface pattern cast by the mold.

FIG. 5 shows the finished stamp 30 after removal from the mold with the stable mesh 1 and a surface pattern 33 cast by the master parent.

Figure 6:
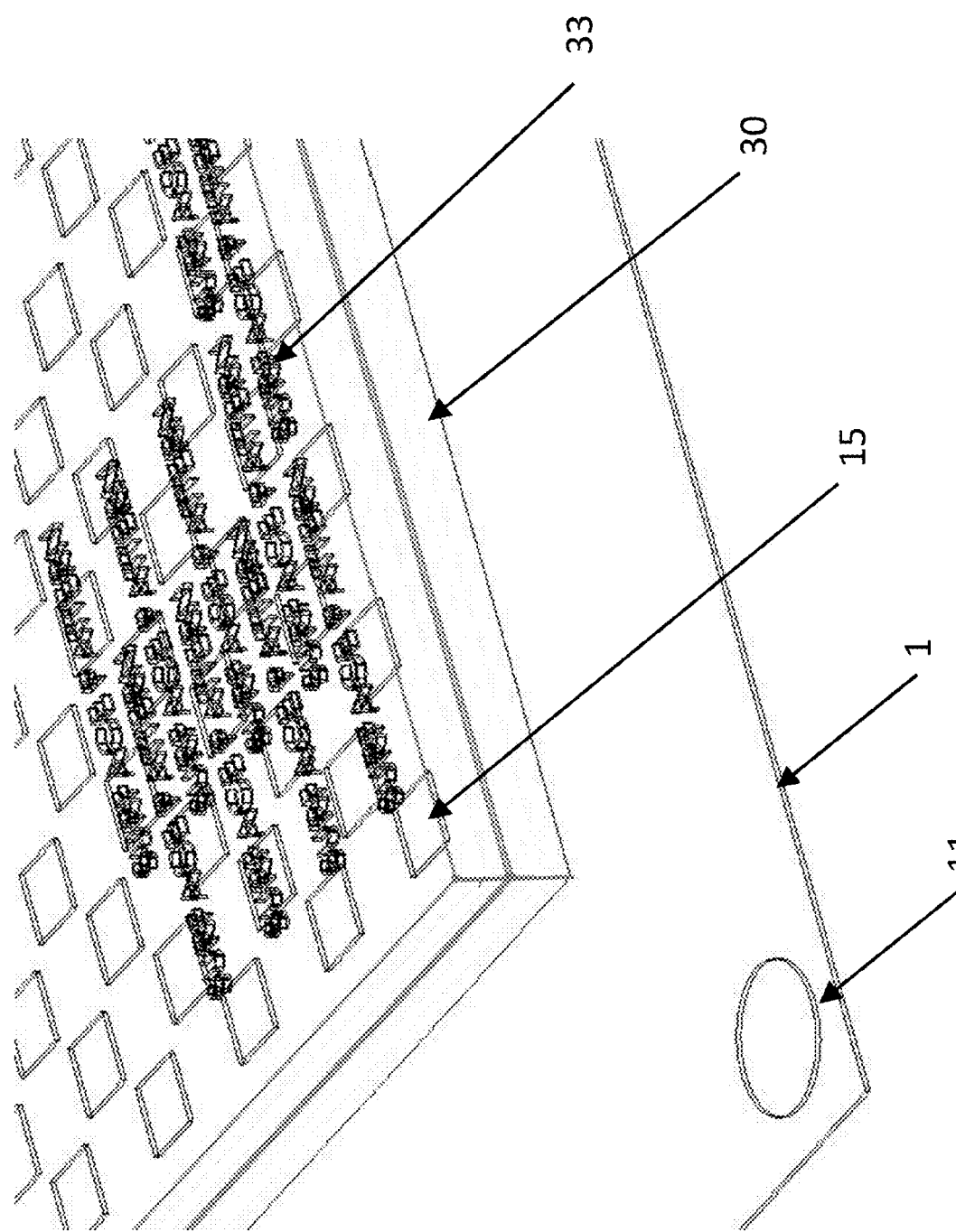
FIG. 6 shows an a second embodiment for the mesh pattern for the stable mesh.

FIG. 6 shows a second embodiment for the mesh pattern for the stable mesh 1 inside the finished stamp 30 with the surface pattern 33 cast by master parent after removal from the mold.

Figure 7:
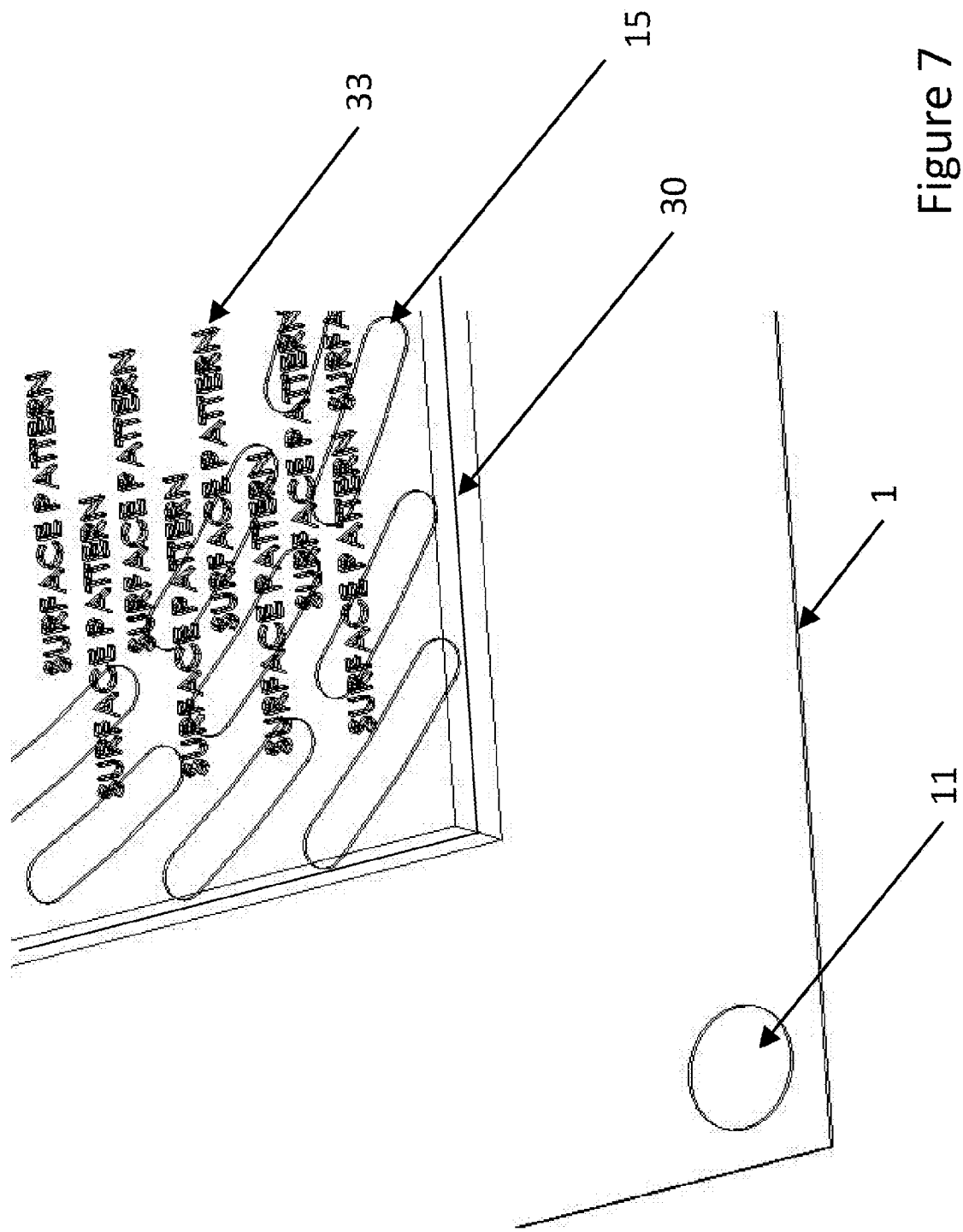
FIG. 7 shows an a additional embodiment for the mesh pattern for the stable mesh.

FIG. 7 shows a third embodiment for the mesh pattern for the stable mesh 1 inside the finished stamp 30 with the surface pattern 33 cast by master parent after removal from the mold.

Referring now to FIGS. 8A and 8B, the stabilizing effect of the mesh on the PDMS stamp will now be shown. The invar stable mesh is strongly resistant to deformation due to changes in temperature or moisture content of the stamp in response to environment or applied heat including radiation, convective, conductive, or resistive heating. Here, deformation refers specifically to changes in dimension or strains in the lateral directions (width and length) of the mesh. The post structures 5 between the holes of the stable mesh act to constrain and stabilize the polymer material, PDMS for example, of the stamp, also in the lateral directions (width and length). FIGS. 8A and 8B shows how the stamp 30 looks in an extreme close-up view where induces strains are greatly exaggerated for this discussion. In FIG. 8A the stamp is in a unstressed state where the temperature of the stamp is close to room temperature and the polymer is flat and straight as shown for the surface pattern surface 35. When the stamp, including the polymer and the stable mesh, is heated up, for example, in response to applied radiation, the polymer with a relative large CTE will attempt to expand. The resulting strain is constrained by the stable mesh structures and only very small deviations, such as the dilated surface structure 36 as shown in FIG. 8B will occur above the stable mesh openings 15. The relatively small openings will greatly limit the maximum extent of the strain of the polymer surface.

Figure 9:
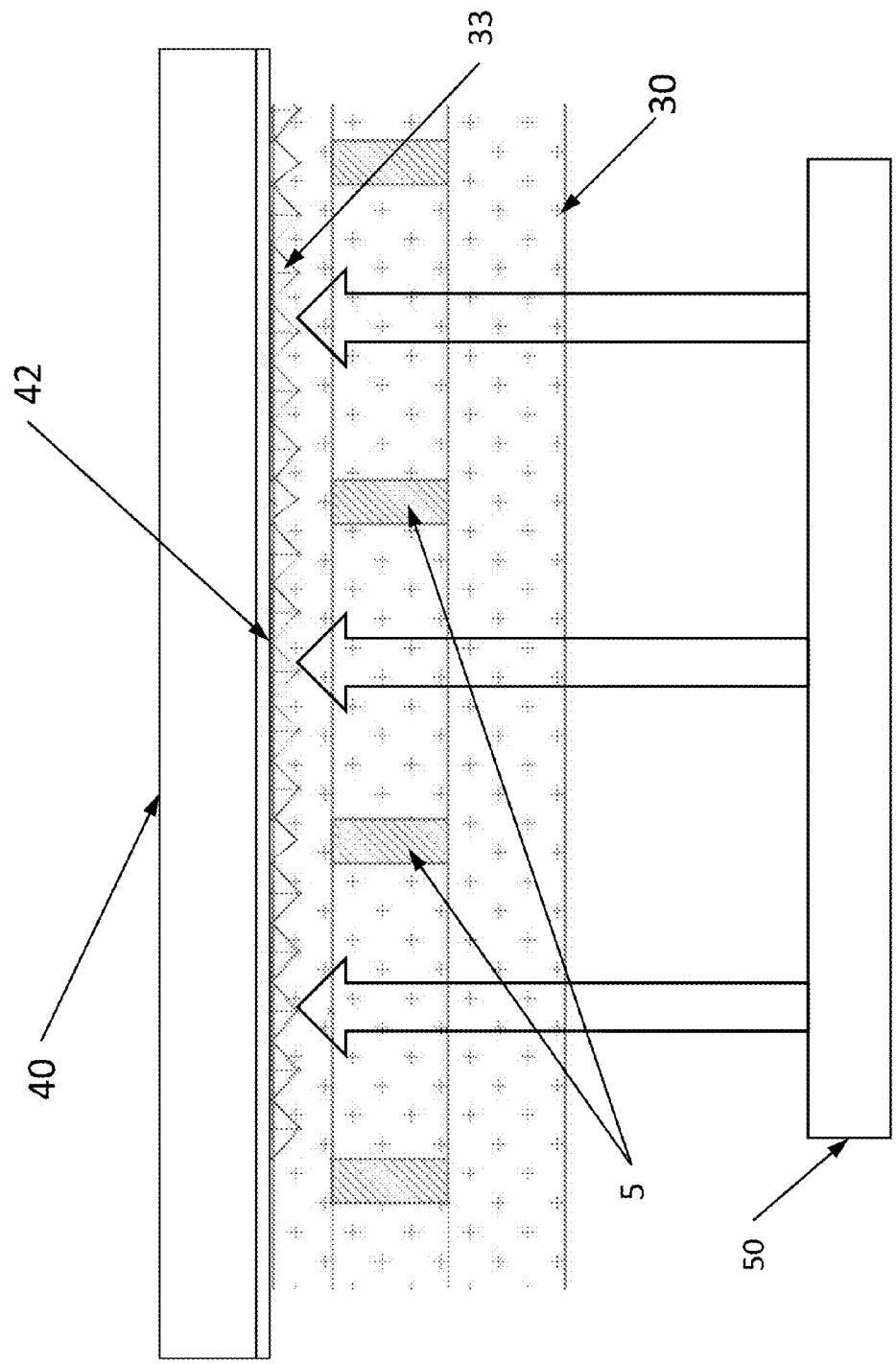
FIG. 9 shows an application of the stamp in a stamping process.

Referring now to FIG. 9, the application of the stamp in a stamping process is now shown. The polymeric stamp 30 is shown in contact with a receiver substrate 40 which has a thermally softened or photo-initiated liquid coating 42 configured to receive the pattern transfer from the stamp. The surface pattern 33 is transferred to the receiver substrate by the application of pressure. Optionally, the receiver substrate 40 can be cured while the stamp is in contact by, for example, the application of actinic light from a light source 50. As shown, the actinic light can pass through the openings in the stabilizing mesh. The mesh is transparent to allow actinic radiation. The ability to cure in place is an important advantage of the stable mesh and allows for the formation of high relief structures by stamping without suffering from reflow.

Figure 10:
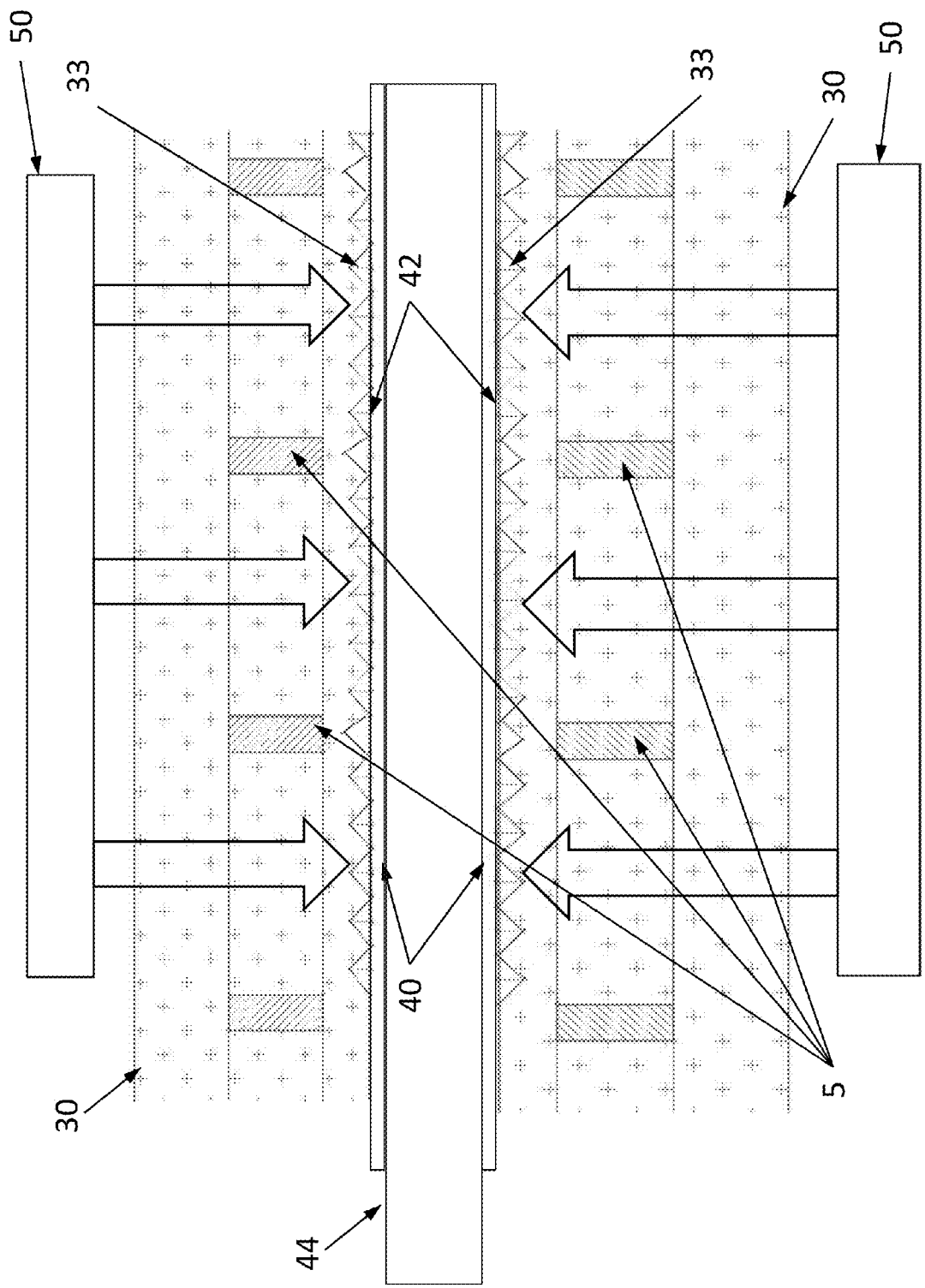
FIG. 10 shows an alternative embodiment using two mesh stabilized stamps to produce a two sided product.

Referring now to FIG. 10, an alternative embodiment for the application of the stamp in a stamping process is now shown, featuring using two mesh stabilized stamps to produce a two sided product. Two polymeric stamps 30 are shown in contact with the receiver substrate with blocking layers 44. The two sided receiver substrate has two substrate surfaces 40 on which is thermally softened or photo-initiated liquid coating 42 configured to receive the pattern transfer from the stamp. The surface patterns 33 are transferred to the receiver substrate by the application of pressure. Optionally, the receiver substrates 40 can be cured while the stamp is in contact by, for example, the application of actinic light from a light source 50. As shown, the actinic light can pass through the openings in the stabilizing mesh. The ability to cure in place is an important advantage of the stable mesh and allows for the formation of high relief structures by stamping without suffering from reflow.

The following are additional feature that are not yet claimed: The stable mesh may contain mounting holes for mounting and/or tension. The perforated openings geometries are unlimited, depending on intended function. The perforated opening can vary within the stable mesh, such as the tiled smaller high-density configurations within the macro perforated sheet. The stable mesh openings may consist of geometry patterns, resulting in a defined flexural movement of the stable mesh backbone. Combining this with the elastomeric properties of the PDMS, the combination may be used as a pneumatic piston to actuate the stamp, while maintaining spatial accuracy of the embossed pattern. When embossing or molding a photo curable polymer, a minimum open area is required to achieve the proper dose of radiation to cure the embossed substrate.

When the stable mesh is made of a metal or reflectively coated plastic, once the radiation passes through the plurality of opening, the reflective surface may aid in cross-linking the polymer by total internal reflection.

It is conceivable to have multiple discrete polymer stamps molded onto the stable mesh backbone, where the solid backbone areas in between the stamp regions block the radiation from hitting the substrate.

The invention has been described in detail with particular reference to certain preferred embodiments thereof, but it will be understood that variations and modifications can be effected within the scope of the invention.

PARTS LIST 1 stable mesh
2 face
3 side
5 structures
11 mounting holes
15 opening
16 mesh sheet fiducial
20 mold
21 master pattern
22 port
26 surface
27 master pattern fiducial
29 cast volume
30 finished stamp
33 surface pattern
35 surface pattern surface
36 dilated surface structure
40 receiver substrate
42 photo-initiated liquid coating
44 blocking layers
50 light source
105 stable mesh
110 lithographic mold
115 master
120 polymer mold
125 stamp
130 cure polymer
135 support

The invention claimed is:

1. A method for forming a non-deformable patterned template, comprising:
   providing a stable mesh, wherein the stable mesh is resistant to deformation;
   providing a curable liquid polymer;
   placing the stable mesh in the curable liquid polymer such that the stable mesh is completely enclosed within the liquid polymer;
   curing the liquid polymer to form a polymer sheet with the stable mesh embedded therein;
   forming a surface pattern on at least one of the faces of the polymer sheet, the surface pattern including at least two fiducial marks; and
   aligning the stable mesh to the surface pattern by placing one or more fiducial marks on the stable mesh and aligning them to corresponding fiducial marks on the surface pattern.

2. The method of claim 1, wherein providing the stable mesh causes the template to resist deformation when the temperature or water content of the template is changed in response to changes in the environment.

3. The method of claim 1, wherein providing the stable mesh causes the template to resist deformation when tension is applied to the template.

4. The method of claim 1, wherein providing the stable mesh causes the template to resist deformation when the temperature of the template is changed in response to applied radiation.

5. The method of claim 4, wherein the radiation includes infra-red light, visible light, electromagnetic induction, or ultra-violet light.

6. The method of claim 1, wherein providing the stable mesh causes the template to resist deformation when the temperature of the template is changed in response to applied heat.

7. The method of claim 6, wherein the applied heat includes radiation, convective, conductive, or resistive heating.

8. The method of claim 1, wherein the mesh is sufficiently transparent to actinic radiation.

9. The method of claim 1, wherein the mesh is formed by producing a pattern of openings in a continuous sheet.

10. The method of claim 9, wherein the mesh defines a plurality of anchor points corresponding to the portions of the continuous sheet remaining after the openings have been formed.

11. The method of claim 10, wherein the anchor points limit the deformation of the polymer sheet to regions of the template corresponding to the openings of the mesh.

12. The method of claim 9, wherein the pattern of openings is a cross-hatch, hexagonal, diamond-shaped, circular, or oval.

13. The method of claim 9, wherein the structure of the pattern of openings causes the mesh to function as a flexure.

\* \* \* \* \*